(12) United States Patent
Suto

(10) Patent No.: US 8,604,820 B2
(45) Date of Patent: Dec. 10, 2013

(54) TEST ACCESS COMPONENT FOR AUTOMATIC TESTING OF CIRCUIT ASSEMBLIES

(75) Inventor: Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 682 days.

(21) Appl. No.: 12/707,930

(22) Filed: Feb. 18, 2010

(65) Prior Publication Data

US 2010/0207651 A1  Aug. 19, 2010

Related U.S. Application Data

(60) Provisional application No. 61/153,469, filed on Feb. 18, 2009.

(51) Int. Cl.
*G01R 31/28* (2006.01)

(52) U.S. Cl.
USPC .................................................. 324/763.01

(58) Field of Classification Search
USPC ............... 324/762.01–762.1, 754.01–754.3, 324/755.01–755.11; 257/48; 438/14–18
See application file for complete search history.

(56) References Cited

U.S. PATENT DOCUMENTS

| 4,977,370 A * | 12/1990 | Andrews | 324/754.08 |
| 5,006,808 A * | 4/1991 | Watts | 324/537 |
| 5,258,648 A * | 11/1993 | Lin | 257/778 |
| 2005/0258846 A1 | 11/2005 | Lee et al. | |

FOREIGN PATENT DOCUMENTS

| JP | 05-226429 | 9/1993 |
| JP | 07-221415 | 8/1995 |
| JP | 00-164772 | 6/2000 |

OTHER PUBLICATIONS

International Search Report and Written Opinion of PCT/US2010/000466 filed Feb. 18, 2010.

* cited by examiner

*Primary Examiner* — Tung X Nguyen
(74) *Attorney, Agent, or Firm* — Wolf, Greenfield & Sacks, P.C.

(57) ABSTRACT

A reliable and durable method of testing of printed circuit boards is presented. Test access components are placed in contact regions for providing electrical connectivity between test probes and the printed circuit board. In some cases, a test access component may be a surface mount resistor. The test access component may provide two points of contact for test probes to make electrical and mechanical contact with the printed circuit board. Test access components may also provide for increased durability of testing, allowing for a greater number of test contacts to be made between test probes and printed circuit boards than were previously possible.

20 Claims, 9 Drawing Sheets

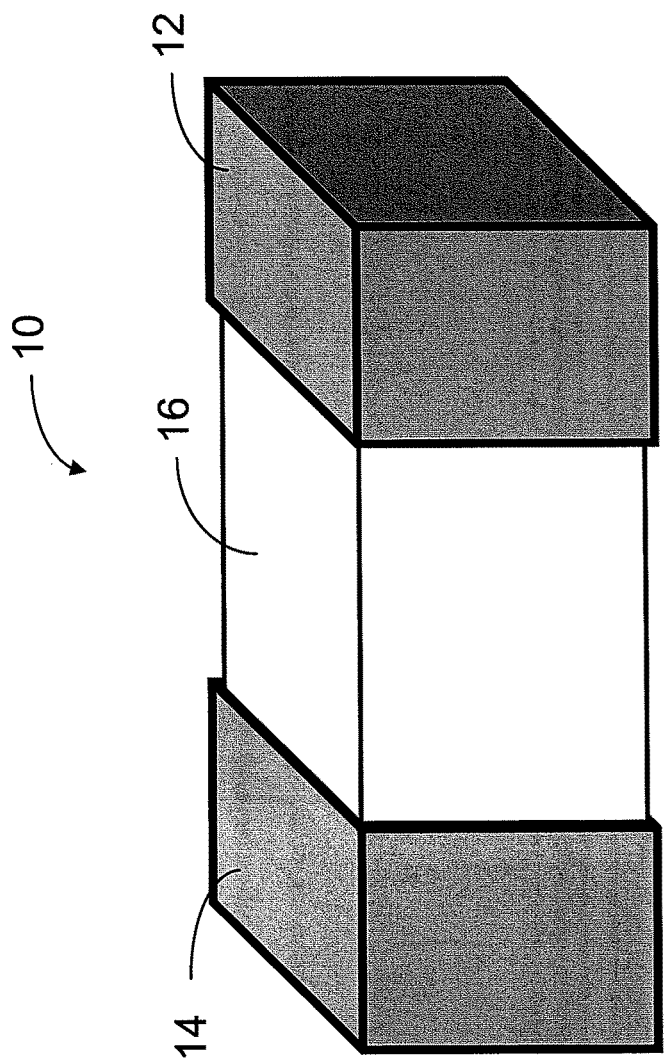

TEST ACCESS COMPONENT FOR AUTOMATIC TESTING OF CIRCUIT ASSEMBLIES

CROSS REFERENCE TO RELATED APPLICATIONS

This application claims priority under 35 U.S.C. §119(e), to U.S. Provisional Patent Application Ser. No. 61/153,469, entitled "TEST ACCESS COMPONENT FOR AUTOMATIC TESTING OF CIRCUIT ASSEMBLIES," filed Feb. 18, 2009, which is incorporated herein by reference.

BACKGROUND

1. Field of the Invention

Apparatuses and methods relating generally to printed circuit board testing, and more particularly to testing dense, high speed, printed circuit boards.

2. Description of Related Art

During the manufacture of printed circuit board assemblies, testing is performed at one or more stages to ensure that the finished product functions adequately. In some manufacturing operations, bare printed circuit boards are first tested before any components are mounted to them. Once components are attached, the populated printed circuit boards are tested again, either simply to ensure that the components are properly connected to the printed circuit boards or to test the functionality of the assembly.

Testing may be performed by connecting test probes to signal transmission paths on the board. These test pads provide electrical test access points for test equipment. In operation, the printed circuit board under test is placed in a fixture that has test probes aligned with the test access points. These probes can sometimes be mounted in fixed locations in the fixture such that each probe makes contacts with a single test pad during an entire test. In this case, multiplexing circuitry within the test system couples test signals to or from different test points at different times during the testing process. Though, some test systems have included robotic arms that moved probes to align with different test pads during testing.

Regardless of whether fixed or moving probes are used, these probes should make contact with enough locations on the printed circuit board so that all, or a very high percentage of the printed circuit board, can be tested. Some manufacturing methods lead to printed circuit assemblies that have many locations where connection for a test system can be made. For example, "through hole" component mounting results in exposed component leads on at least one side of the printed circuit boards that provides a large number of points that can be easily probed for test access. Though, because of the size of printed circuit boards using through hole mounting and other drawbacks, this approach is not widely used. Rather, surface mount techniques are more commonly used.

In surface mount techniques, components are first placed on the printed circuit board with conductive leads (sometimes called "pins") of the components aligned with pads on the surface of the printed circuit board. Solder, or solder paste that turns into solder when heated, is placed between the lead and pad and then melted in a reflow operation. When the solder cools, it forms a connection between the lead and the pad. Surface mount leads can be much smaller than through hole leads, making it more difficult to probe surface mount leads for testing. In addition, some surface mount techniques, such as Ball Grid Array attachment, have leads on the bottom surfaces of components, which cannot be contacted during a test. Thus, changes in manufacturing processes have reduced test access.

One approach to testing that reduces the need for test access points is called capacitive testing. In a capacitive "opens" test, a probe that includes a sense plate is pressed against a component with a pin to be tested. A test signal is generated at a point on the circuit assembly that should be connected to the pin under test in a properly manufactured circuit assembly. If the pin under test is properly connected to the circuit assembly, the test signal will propagate from the circuit assembly through the pin to conducting structures within the component. Though the probe plate is separated from those conducting structures, the test signal can capacitively couple to the probe plate. During a test, the signal received at the probe plate is analyzed to determine whether the test signal has been capacitively coupled to the probe plate, indicating that there is a good connection between the assembly and the pin of the component.

Capacitive testing is useful for testing for shorted or opens pins, but does not generally provide test access for other types of testing. Also, not all points at which test signal is to be injected or measured during a test can be accessed with capacitive testing. Thus, there is still a need for test access points.

Thus, in many circuit assemblies, test access points were incorporated into the surface of the printed circuit board. Test access points in the past were generally circular targets, approximately 28 mils to 35 mils in diameter, connected to traces on the printed circuit board. In some cases, these targets could be via pads surrounding vias already provided in the printed circuit. Though, in many cases, these targets were added test pads.

These test pads add capacitance to the signal traces to which they are connected. The added capacitance changes the impedance of the signal traces. With advances in integrated circuit technology, signal speeds are becoming greater. For high speed signals, changes in impedance can cause reflections or other undesirable effects that interfere with reliable signal transmission. As a result, test pads may limit the signaling speed that may be reliably achieved on a transmission path and therefore disrupt operation of a printed circuit board that has been modified to include test pads.

In addition, as manufacturing technologies allow smaller printed circuit boards, test targets are increasingly difficult to contact reliably and repeatably, especially when a test fixture may contain several thousand such probes. An alternative to probing test pads is to place solder bumps or beads on a surface of a printed circuit board. The solder bumps extend above the surface of the board such that a flat probe can contact a solder bead to couple signals to or from the printed circuit board for testing. The flat probe can be wide to companionate for any imprecision in the placement of the solder bump or the pad. Consequently, the solder beads can be made smaller than test pads conventionally used for test access.

SUMMARY

The inventor has recognized and appreciated that the available range of test techniques is not adequate to cover all scenarios. For example, when solder beads are used to provide test access, an oxide coating forms on the solder. That coating must be removed for a reliable electrical connection to the solder. Some form of mechanical approach is used to break up the oxide layer. Probes that wobble or swipe the solder bead as they make contact can break up the oxide layer, but add unnecessary expense. A simple flat probe may be pressed against the solder bead can break up the oxide layer. However, both of these approaches can deform the solder bump each time contact is made to it for testing. Consequently, the number of times that test access can be reliably achieved through the same solder bump is limited.

Lack of repeatable electrical contact can be undesirable for multiple reasons. For example, if a test pad is contacted more than once during a test, such as may occur in a test system with a robotic probe assembly, test results may be inconsistent or unreliable, forcing unnecessary scrapping or rework on boards that actually functioned properly. A similar problem may occur if a board is retested as a result or rework or is tested multiple times during a manufacturing operation.

A reliable approach for testing of high density printed circuit boards is provided by incorporating test access components for testing. The test access components can be soldered directly to traces on the printed circuit board using a reflow soldering operation. Depending on the relative width of the traces and the test access components, the components can be soldered without adding pads to the traces or with only very small pads that do not have a significant impact on the impedance of the trace. Impedance impact of pads can be reduced in some embodiments through the selective placement of openings in a reference structure within the printed circuit board.

Use of a test access component can also be relatively low cost. The test access components can be configured as conventional surface mount components that would otherwise be used as part of a surface mount manufacturing process. Accordingly, the test access components do not require a manufacturing step.

Additionally, many conventional surface mounted components have conductive end caps on two ends. These end caps can provide two points of contact when contacted by a flat probe with a diameter larger than the length of the component. Two points of contacts provides redundancy that increases the probability that a reliable connection between a test system and the underlying printed circuit board.

Further, no special probe design is required. A conventional flat probe may be employed. Such a probe may include an uneven surface with ridges or points that can pierce any oxide layer that may build up on test access component. Because the component is made of a durable material, the pressure of the probe does not deform the component, allowing a test access component to be reliably contacted numerous times during a test process, multiple test processes or even during re-testing following rework.

In one illustrative embodiment, an electrical assembly for testing of a printed circuit board is provided. The electrical assembly includes a printed circuit board; a conductive trace on the printed circuit board; and a contact region associated with the conductive traces on the printed circuit board, the contact region including a test access component having two points of electrical contact.

In another illustrative embodiment, an electrical assembly for testing of a printed circuit board is provided. The electrical assembly includes a printed circuit board; a conductive trace on the printed circuit board; solder paste disposed on the conductive trace; and a resistor disposed on the solder paste, the resistor having two points of electrical contact.

In yet another illustrative embodiment, a method of testing a printed circuit board is provided. The method includes providing a printed circuit board with a conductive trace disposed within the printed circuit board; placing solder paste on the conductive trace; placing a test access component on the solder paste; and contacting a test probe with the test access component such that electrical conductivity is established between the test probe and the printed circuit board.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings:

FIG. 3A is a perspective schematic of a test access component according to some embodiments;

DETAILED DESCRIPTION

Figure 1:
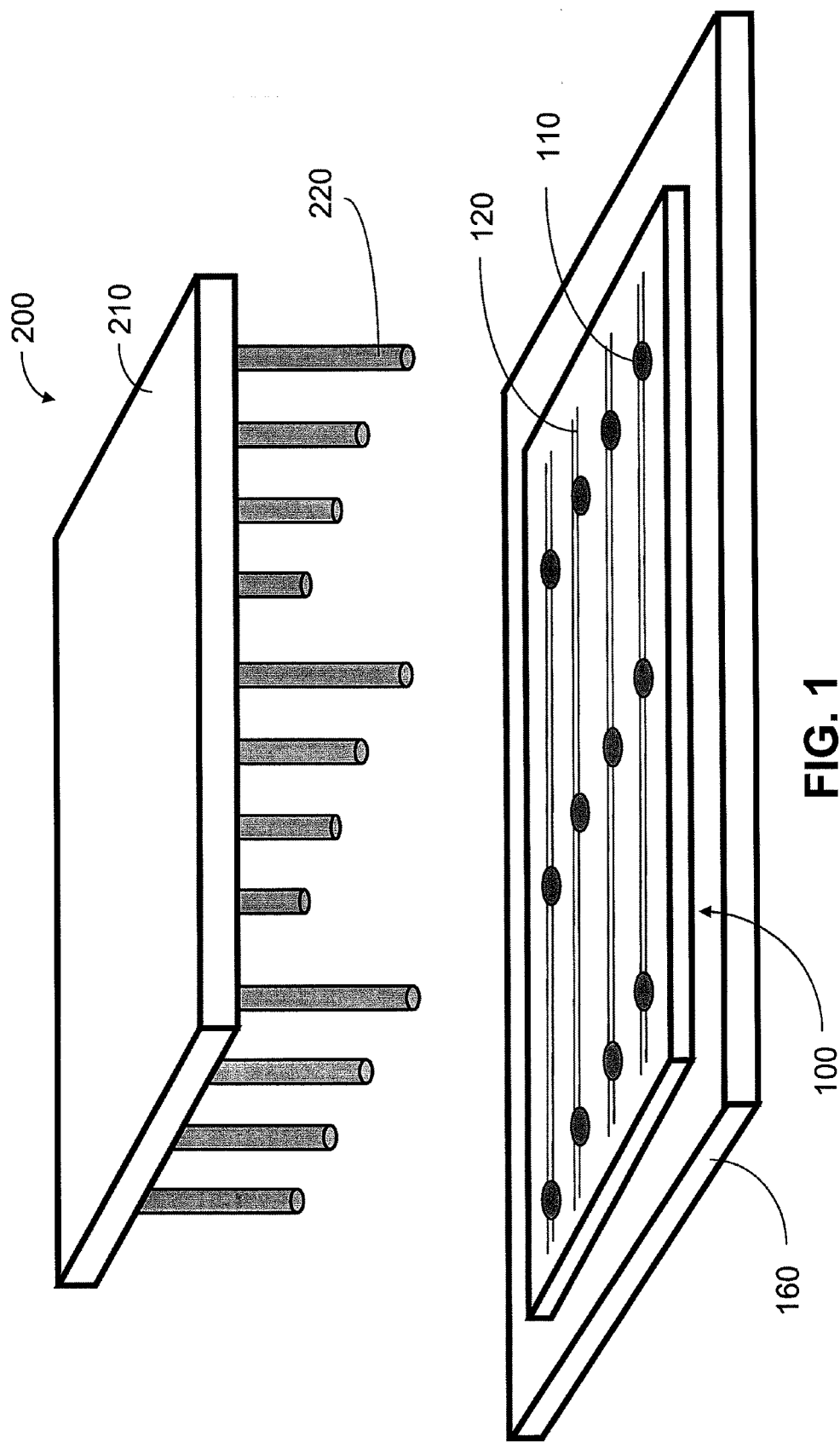
FIG. 1 is a perspective schematic of a test system.

The aspects described herein are not limited in its application to the details of construction and the arrangement of components set forth in the following description or illustrated in the drawings. Other embodiments may be employed and aspects may be practiced or be carried out in various ways. Also, the phraseology and terminology used herein is for the purpose of description and should not be regarded as limiting. The use of "including," "comprising," "having," "containing," "involving," and/or variations thereof herein, is meant to encompass the items listed thereafter and equivalents thereof as well as additional items.

Aspects described herein are related to more reliable testing of printed circuit boards through use of a test access component suitably positioned on signal contact traces, the test access component serving as an appropriate target for contact of large test probes to the printed circuit board. The test access component may provide two points of contact for test probes to make electrical and mechanical contact with the printed circuit board. In addition, the test access component may provide for increased durability of testing, allowing for a greater number of test contacts to be made between probes and printed circuit boards. Further, the test access components may be soldered to exposed signal traces using conventional surface mount manufacturing techniques, with little or no added trace material to support the connection. As a result, use of test access components provides a low cost approach for increased reliability and durability in testing printed circuit boards.

Referring to the figures, FIG. 1 depicts schematically a printed circuit board 100 that is to be tested using equipment as is known in the art. The printed circuit board 100 is mounted on a frame 160 commonly used for testing of printed circuit boards, which may be part of a test fixture. The printed circuit board 100 is typically mounted in a temporary fashion on the frame 160 so that numerous printed circuit boards may be tested with the same test system as part of a manufacturing operation.

Printed circuit board 100 includes contact regions 110 that are in electrical contact with signal conductors 120. Signal conductors 120 may be in electrical contact with other components incorporated within the printed circuit board 100 (which are not shown for simplicity). Once test probes are placed in electrical communication with the contact regions 110, then suitable electrical testing may occur.

FIG. 1 also depicts test fixture 200 that includes a test fixture cover 210 along with test probes 220 mounted to test fixture cover 210. When printed circuit board 100 is to be tested, test fixture cover 210 is closed by moving it towards frame 160. This action places test probes 220 in contact with contact regions 110.

The test fixture may be controlled in any suitable manner. In some embodiments, the test fixture 200 may be automatically maneuvered by a mechanical manipulator. The mechanical manipulator is not expressly shown in FIG. 1, but may include a hinged connection between test fixture cover 210 and frame 160 and a mechanical actuator, such as a motor or vacuum driven mechanism.

Components within a test system for generating and measuring test signals are not expressly shown in FIG. 1. However, components such as well known in the art may be included as part of the test system illustrated in FIG. 1. Those components may include one or more voltage sources, current sources, digital signal generator, arbitrary waveform generators or other signal sources. In addition, these components may include measuring devices including digitizers, voltage meters, current meters, or ohm meters. Further, multiplexing and control circuitry may be used.

The embodiment illustrated in FIG. 1 does explicitly show the nature of the test probes 220 in their size or any other important structural considerations. The nature of contact regions 110 regarding their structure are also not explicitly shown in FIG. 1. Such structural considerations for the test probes 220 and the contact regions 110 will be discussed later. In the embodiment shown, the test fixture 200 includes twelve test probes 220 for testing twelve contact regions 110 on a printed circuit board 100. It should be appreciated that any suitable configuration of test probes on a test fixture may be used for making contact and testing the contact regions of a printed circuit board of any appropriate configuration. The embodiment shown in FIG. 1 is only meant to depict an illustrative example of a possible testing system for a printed circuit board.

Figure 2:
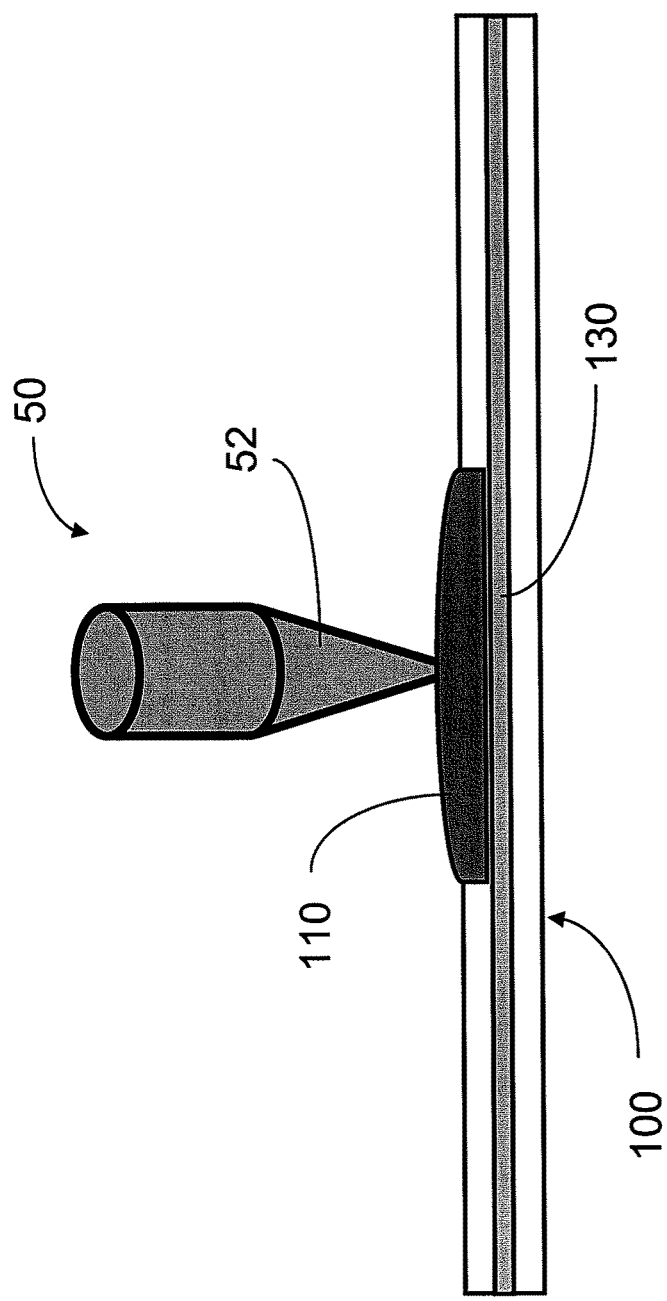
FIG. 2 is a side view of a standard test probe engaged with a test pad on a printed circuit board according to some embodiments.

FIG. 2 depicts a schematic illustration of a conventional test probe 50 coming into contact with a contact region 110 of a printed circuit board 100. In the figure, test probe 50 is lowered toward the contact region 110 of the printed circuit board 100 such that the test probe contact region 52 of the test probe 50 is placed in contact with the contact region 110 of printed circuit board 100. FIG. 2 also depicts a conductive trace 130 as integrated with printed circuit board 100. Conductive trace 130 may provide an electrical pathway for signals to be communicated between different sections of printed circuit board 100 such that components mounted to printed circuit board 100 can be electrically connected.

In some embodiments, contact region 110 may be a contact pad that is pre-formed on the printed circuit board 100. In some embodiments, the pad may be coated with solder. As depicted, the test probe 50 is generally small compared with the contact region 110. As a result, test probe 50 is relatively pointy relative to the area of contact region 110 and will therefore pierce any oxide that forms on the solder. Also, the relative dimensions of the test probe and contact region are such that the tolerance for contacting the test probe 50 with the contact region 110 is suitable for some circuit boards. However, for small printed circuit boards, testing with a small test probe 50 on a contact region 110 is subject to errors because of misalignment of the test probe and contact pad or can require expensive precision manufacture of the test fixture. As a result, it would be advantageous to provide for testing situations where the test probe is able to contact a smaller contact region.

Providing test access with a test access component provides for reliable contact even though a relatively small area of the printed circuit board is required for the component. A schematic of an embodiment of a test access component 10 is provided in FIG. 3A. An image of an embodiment of a test access component 10 is also provided in FIG. 3B. The test access component 10 may be coupled with a contact region on a printed circuit board by any suitable manner As depicted, the test access component 10 includes two conductive regions 12 and 14 on opposing ends of a central region 16. The test access component may have a size and shape of a surface mount component. Manufacturing equipment to place surface mount components on printed circuit boards is known in the art and commercially available. Moreover, reflow ovens and other equipment to electrically connect surface mount components to a printed circuit board are known in the art and commercially available. Accordingly, configuring the test access component with the size and shape of a surface mount component allows it to be attached using existing equipment. In some embodiments, the test access component could be placed and soldered as part of operations that would otherwise occur during manufacture of a printed circuit board, contributing to low cost and ease of use of the test access component.

In some embodiments, test access component may simply be a conductive member, such as a piece of metal. In such embodiments, conductive regions 12 and 14 and central region 16 may be integral regions of a metal member. In other embodiments, test access component 10 may be a surface mount component, such as a resistor. In such embodiments, central region 16 may be a portion of a resistive member and conductive regions 12 and 14 may be conductive end caps.

Test access component 10 may be any suitable resistor component, with any appropriate geometry and resistive properties. Embodiments of resistor components that may be appropriate for test access component 10 for use in a printed circuit board include 01005 resistors, 0201 resistors, 0402 resistors, 0603 resistors, 0805 resistors, 1206 resistors, 1210 resistors, 1812 resistors, 2010 resistors, 2512 resistors, and/or any combination of resistors that may be suitable for use as a test access component. In some cases, for example, a zero Ohm resistor may be used as a surface mount component.

In various embodiments, the test access component may be a hexahedron in shape. In some embodiments, the test access component may be rectangular in cross-section. Indeed, the test access component may be formed in any suitable shape or configuration.

It can be appreciated that the size of the test access component may be as appropriately determined. For example, a 01005 resistor may be approximately 0.005 inches wide and approximately 0.01 inches long; a 0201 resistor may be approximately 0.01 inches wide and approximately 0.02 inches long; and a 0402 resistor may be approximately 0.02 inches wide and approximately 0.04 inches long. Alternatively, a 01005 resistor may be approximately 0.20 mm wide and approximately 0.40 mm long; a 0201 resistor may be approximately 0.3 mm wide and approximately 0.6 mm long; and a 0402 resistor may be approximately 0.5 mm wide and approximately 1.0 mm long. In some embodiments, the size of the test access component may be selected to have a width approximately equal to the width of a trace to which it is mounted. In some embodiments, the width of the test access component may be less than the trace width. Though, in some embodiments, the test access component may be slightly wider than the nominal trace width. In some such scenarios, a small widening of the trace, relative to its nominal width, may be made at locations where the ends of the test access component are to be attached to the printed circuit board.

It should be understood that any suitable resistance and dimension of the test access component may be appropriate for testing of printed circuit boards, as presented herein. For example, a 0 Ohm resistor may be used. Though, in other embodiments, higher value resistors may be used. For examples resistors of approximately 5 Ohms, 10 Ohms, or 20 Ohms may be used.

Figure 3B:
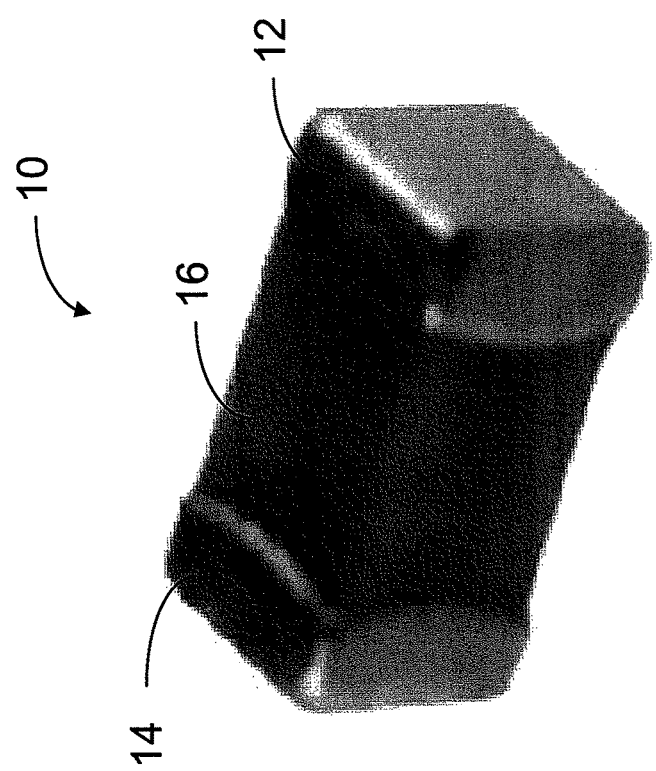
FIG. 3B is a perspective view of a test access component according to some embodiments.

In some embodiments, the test access component 10 may be a commercially available surface mount component. In some embodiments, the test access component 10 may be shaped similar to a conventional surface mount component. Such components may be soldered to conductive structures on the surface of a printed circuit board, such as a conductive trace. Conventional surface mount components may be preferred as such components may be readily available and inexpensive to use in a manufacturing process. Conventional printed circuit board design tools may also be used for specifying the parameters of manufacture and construction of a printed circuit board to receive appropriately chosen components. Additionally, conventional components may be packaged for handling by conventional surface mount equipment, providing for conventional assembly tools and processes to be used in making printed circuit boards that contain test access components. In some embodiments, conventional surface mount components may include conductive end caps on their upper surfaces that provide locations that may be probed, as shown in FIGS. 3A and 3B.

A test access component provides one or more conductive regions raised above the surface of an insulative region of a printed circuit board. In some cases, the surfaces of conductive end caps on either side of the test access component surrounding the insulative central region may be raised above the surface of the surface of the printed circuit board. Thus, the test access component provides a location where a probe can make electrical connection to a test access point.

In embodiments in which the conductive regions 12 and 14 extend above central region 16, such as when the conductive regions 12 and 14 are conductive end caps, upon contact of a test probe with a test access component, the test probe may contact the surface(s) of conductive regions 12 and 14 while not contacting the surface(s) of the insulative regions. In this way, two points of contact may be provided.

Though, it can also be appreciated that, for a test access component, it is not a requirement for the surface of a conductive region to be raised above the surface of an central region 16. Indeed, the surface of the conductive region can be at a similar level to that of the surface of the insulative region such that upon contact of a test probe with a test access component, the test probe may contact the conductive region in addition to the insulative region.

Figure 4:
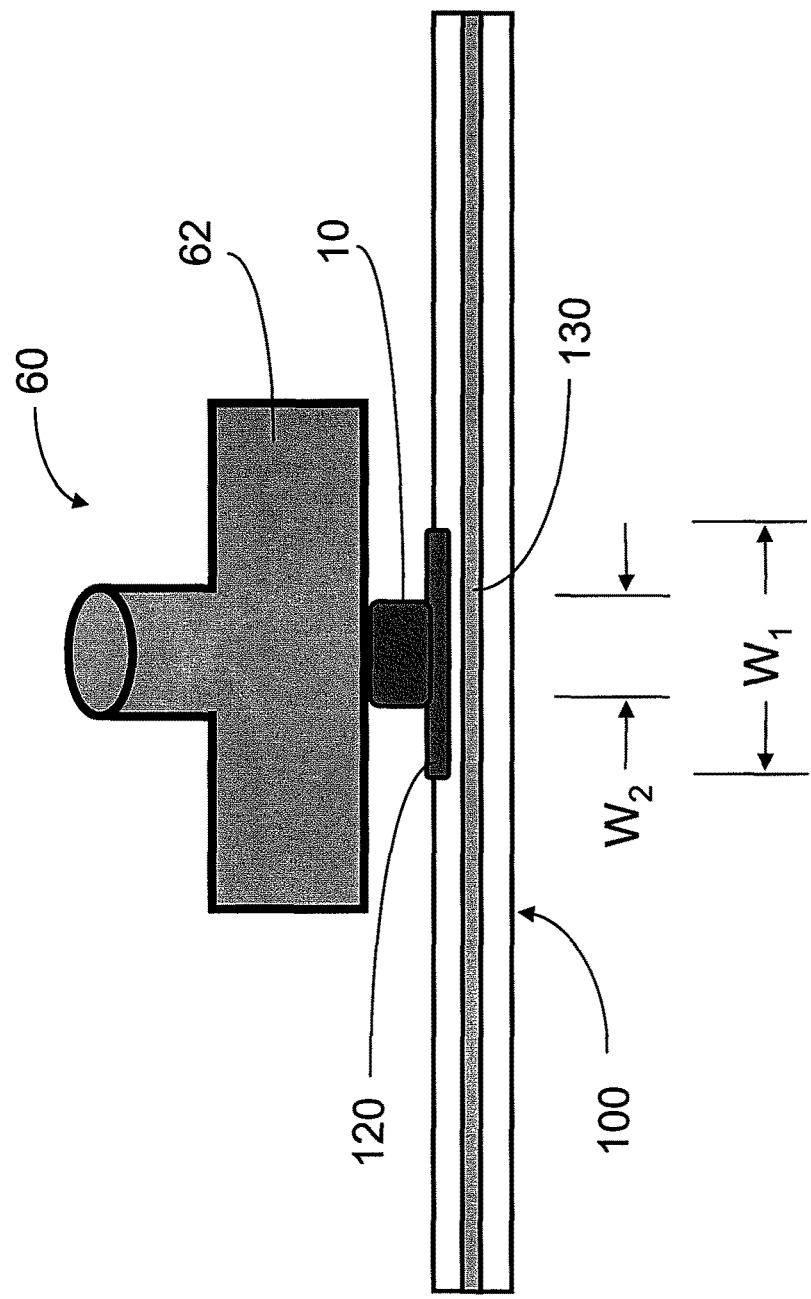
FIG. 4 is a side view of a test probe engaged with a printed circuit board incorporating a test access component according to some embodiments.

In contrast to the embodiment presented in FIG. 2, where a relatively small test probe is used for contacting a relatively larger contact region that is in mechanical and electrical contact with a printed circuit board, FIG. 4 depicts an illustrative embodiment where a relatively large test probe is used for contacting a relatively smaller contact region that is in electrical contact with a printed circuit board. In FIG. 4, test probe 60 includes test probe contact region 62 that incorporates a relatively large surface area for contact with a test access component 10 of a printed circuit board 100. In this regard, the test probe 60 includes a contact surface that is greater in surface area than the surface of the test access component 10.

As depicted, in some embodiments, test access component 10 is soldered on to a printed circuit board with solder 120. In some cases, solder is used to maintain adherence of test access component 10 for connectivity with printed circuit board 100. Though, other attachment mechanisms may be used in some embodiments, such as a conductive adhesive. As another example, test access component 10 may be appropriately welded or bolted to the printed circuit board. It should be appreciated that any suitable method may be used in electrically and mechanically coupling the test access component 10 to conductive regions on the printed circuit board 100.

Printed circuit board 100 may also include conductive trace 130 as an electrical signal carrier within the printed circuit board. Although not shown, conductive trace 130 may provide electrical connectivity between regions of printed circuit board 100 and test access component 10 may provide connectivity between conductive trace 130 and test probe 60.

Figure 5:
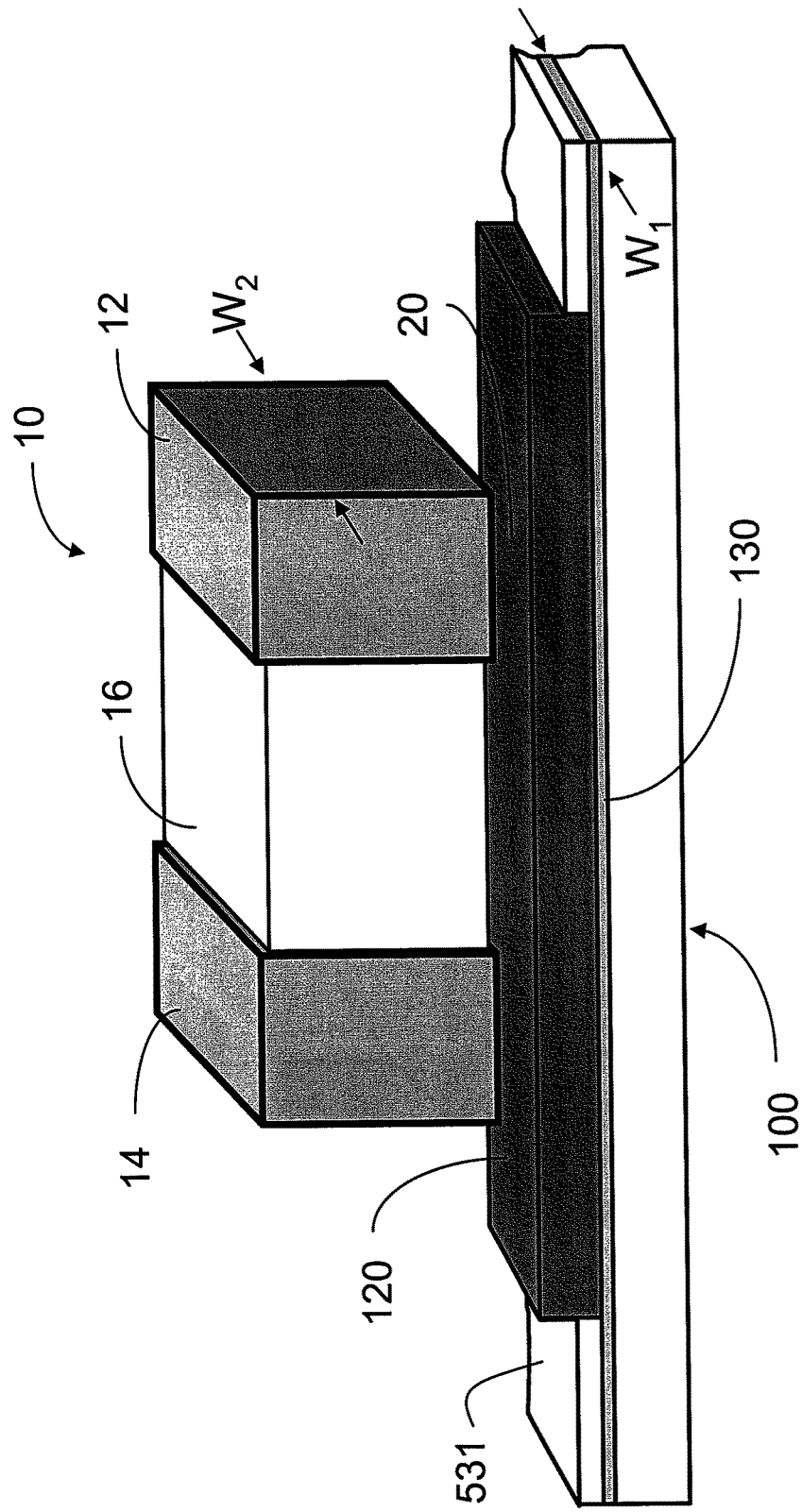
FIG. 5 is a perspective schematic of a test access component in engagement with a printed circuit board according to some embodiments.

FIG. 5 depicts an illustrative embodiment of a manufacturing operation during which a test access component 10 is placed in electrical connectivity with printed circuit board 100. Test access component 10 provides test access points through attachment of components to the surface of the printed circuit board 10 through any appropriate surface mount technology.

In the embodiment illustrated printed circuit board 100 is been manufactured as a bare board. In the state illustrated in FIG. 5, that bare board is undergoing a stage of printed circuit board manufacture sometimes called "place." As can be seen, the upper surface of the board includes a layer of insulative material, sometimes called a solder mask 531. Thus, over most of upper surface of printed circuit board 100, solder mask 531 covers conductive trace 130.

However, a window has been formed in solder mask 531 over conductive trace 130 where test assess component 10 is to be mounted. Solder paste 120 is placed over the conductive trace 130 within this window and the test access component 10 is placed on the solder paste 120. The arrows depicted by reference number 20 depict the test access component 10 being placed on the solder paste 120 for adherence to the printed circuit board 100. Solder paste may be applied in this fashion in a solder screening stage or other suitable manufacturing stage.

After the test access component is placed in the solder paste, the printed circuit board 100 may be heated to a temperature that melts solder within the solder paste. Volatile components of the solder paste are driven off, leaving molten solder that solidifies and secures the test access component to the trace.

As illustrated in FIG. 5, conductive trace 130 runs under component 10 such that the conductive end regions 12 and 14 of component 12 make two points of contact between component 10 and conductive trace 130. As a result, the conductive trace shorts out the conductive regions 12 and 14. Such a configuration is useful in reducing harmful changes in impedance at the location at which component 10 is mounted to trace 130. Also, shorting out conductive regions 12 and 14 reduces the effect of the specific component use to provide test access, enabling many types of surface mount components to be used. For example, capacitors or inductors can be used instead of or in addition to resistors for providing test access.

Though not shown in FIG. 5, other surface mount components may be attached using the same processing that is used to mount a component for test access. Specifically, opening in solder mask 531 can be made to expose conductive structures to which those other components can be attached. Solder paste may similarly be applied. That solder paste may be reflowed, securing the other components to the printed circuit board. In this way, attachment of a test access component may be integrated into a manufacturing process for a printed circuit board with no additional processing steps.

As shown, the nominal width of conductive trace 130 is $W_1$, which is larger than the width, $W_2$, of test access component 10. In this scenario, test access component 10 may be soldered directly to conductive trace 120. In embodiments in which the nominal trace width is less than the width of a test access component, the width of conductive trace 130 may be slightly increased in the vicinity of the end caps of the test access component.

Figure 6:
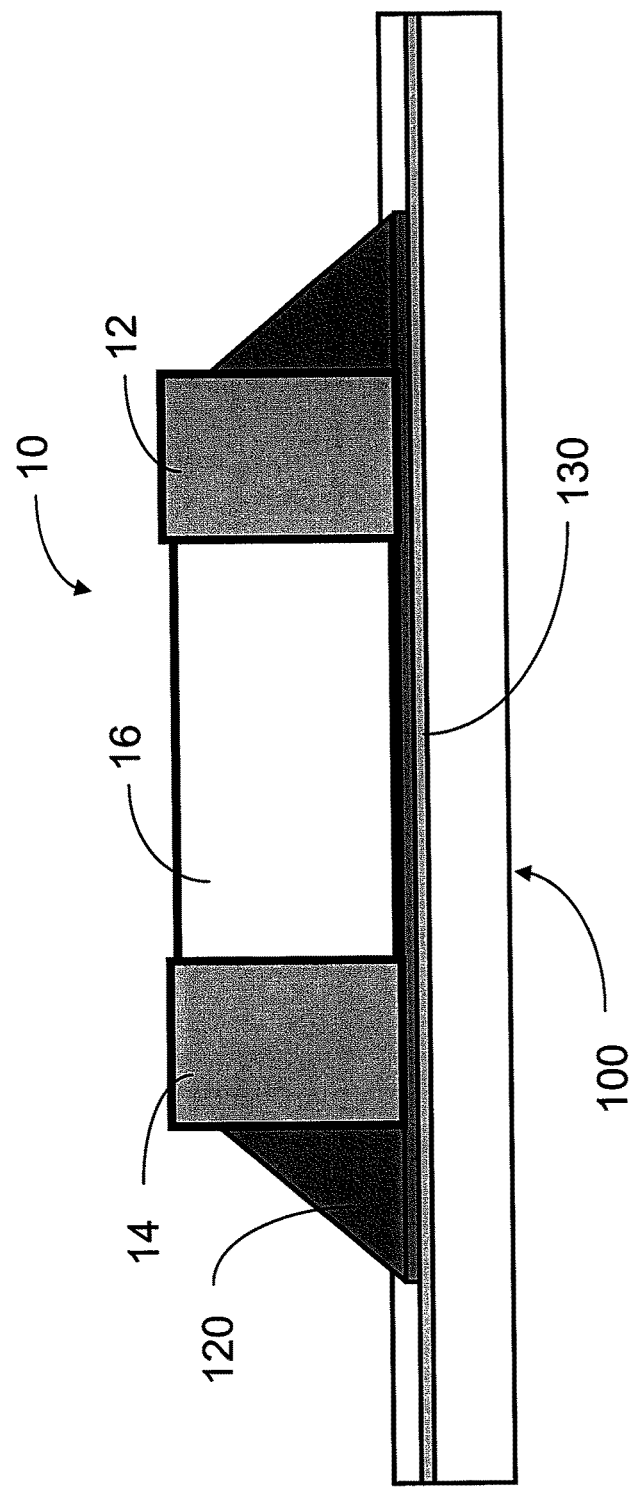
FIG. 6 is a side schematic of a test access component in engagement with a printed circuit board according to some embodiments.

FIG. 6 shows an illustrative side view embodiment of a test access component 10 that is soldered to a printed circuit board 100 after the reflow stage as described above. As the solder paste reflows, it adheres to the conductive end-caps of the test access component, causing solder fillets 120 between the test access component and the underlying conductive trace, forming an electrical and mechanical connection between the component and the conductive trace. As shown, solder paste may also wick up the sides of the end caps, allowing for a stronger adherence of the test access component and the printed circuit board. Such a configuration occurs when the width of the trace in the vicinity of the end caps is greater than the width of the end caps. In scenarios when the nominal width of the trace is not wider, the trace may be widened slightly in those areas.

As described above, placement of the test access component on the printed circuit board may be performed with common manufacturing methods typically used for placing components on printed circuit board. In addition, commercially available probes may be used to contact the test access components during testing, further providing for an added advantage in ease of manufacturability.

Figure 7:
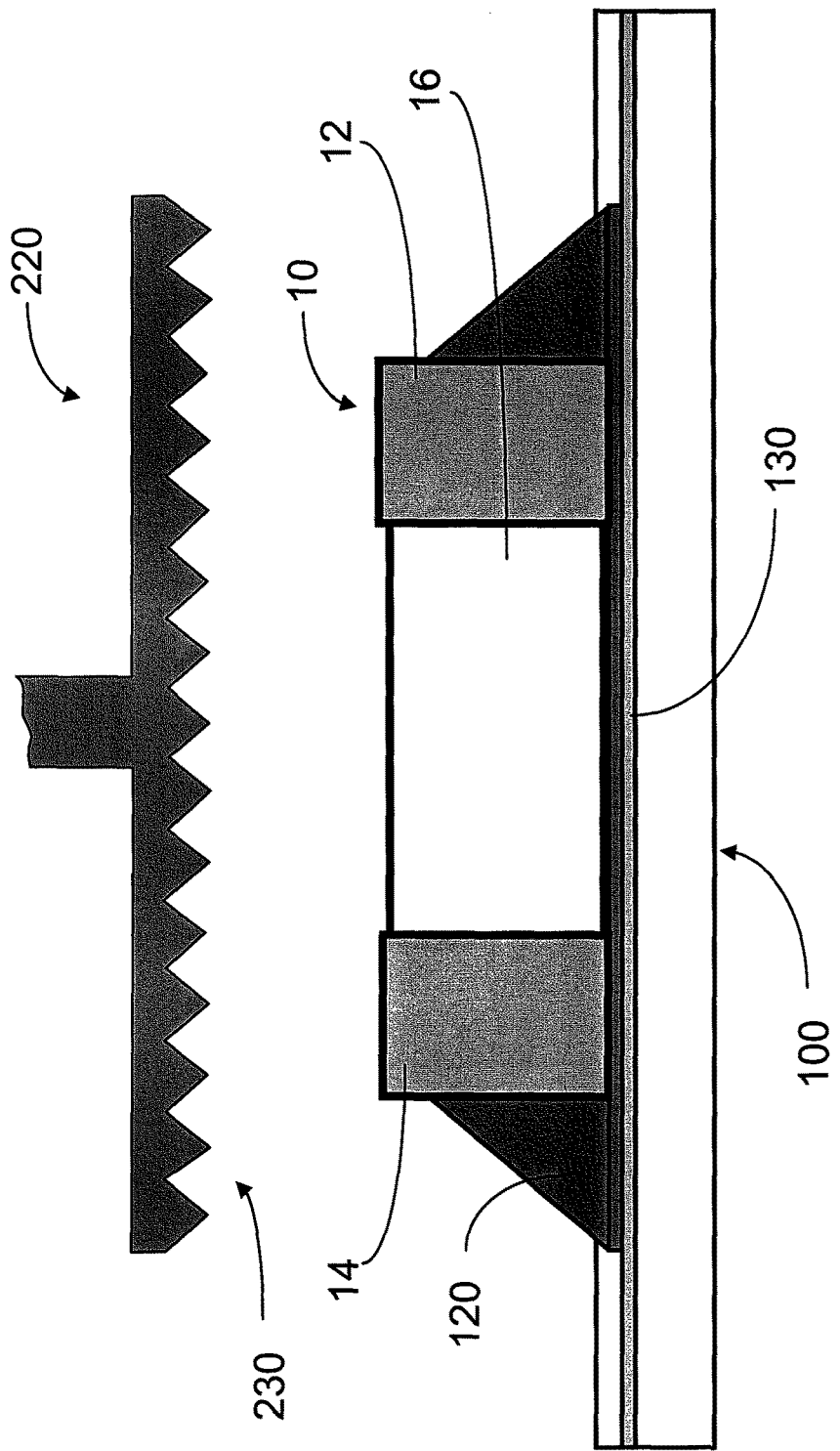
FIG. 7 is a side schematic showing a probe and a test access component in engagement with a printed circuit board according to some embodiments.

FIG. 7 shows an illustrative side view embodiment of a test access component 10 that is soldered to a printed circuit board and a test probe 220 that is close to making contact with the test access component 10. Once the test access component 10 is soldered to the printed circuit board 100, the conductive regions 12 and 14 are end-caps that may provide a location where the test access component 10 may be probed. Because the end-caps are electrically connected to the conductive trace 130, signal levels on the conductive trace 130 may be sensed by contacting a probe to the upper surface of the conductive end-caps of the test access component 10. Moreover, because, in the embodiment illustrated, the end caps are already shorted together through trace 130, no special considerations need be taken to prevent a test probe from contacting both end caps simultaneously. To the contrary, selecting a probe wide enough to contact both end caps simultaneously provides for redundant points of contact, which may be desirable.

Conventional fixture test probes may be used for probing the test access component 10. In some embodiments, such conventional test probes may have sharp or jagged edges 230 on a test surface of the test probe that will pierce an oxide layer or other contaminants that may have formed on the conductive end-caps. These probes are sometimes called "waffle" probes because they are flat, like a waffle, but have transverse groups of parallel ridges. In the case of the waffle probe, each of the ridges is sharp and can pierce an oxide layer that may form on the conductive regions 12 and 14.

Though, in some embodiments, there may be less of a tendency for oxide layers to form on test access components as compared to solder. As a result, there may be less of a need for an oxide layer to be punctured by test probes having sharp or jagged edges. In these scenarios, test probes having a relatively smooth test surface may be used for contacting test access components. However, even if there may be less of a tendency for oxide layers to form on a test access component as compared to solder, it may be possible for test probes that include sharp or jagged edges to be used as well.

As can be seen from the foregoing, use of a test access components provides for advantages over techniques that use solder bumps. One advantage of using a test access component over previous solder paste arrangements is that there are two contact points for the test access component to contact the test probe as opposed to having one contact point that a mound of solder may provide. In this regard, using a test access component to provide a small test target that has two contact points provides for more reliability and a less likelihood for continuity or resistance problems to occur.

Another advantage of using a test access component over previous solder bump arrangements is that use of a test access component provides for a greater degree of mechanical stability and durability for tests to occur. Solder bumps will generally be malleable, and as a result, with every test contact that is made between a test probe and a mound of solder paste, the solder will compress. Such likelihood for solder paste to deform decreases the durability of cycles of testing. In addition, when the solder bump compresses, then the regularity for each test contact will be affected, as contact between a solder ball and a test probe will be less consistent with each progressive test contact. In some cases, if the temperature is raised, solder paste balls will reflow, decreasing test contact consistency even more.

Furthermore, solder bumps have a tendency to develop oxide layers on the surface upon exposure to air, limiting the lifetime of solder bumps for use in testing printed circuit boards. In this regard, oxide layers may limit electrical signal conductivity upon contact with a test probe. In some cases, it may be beneficial for a test probe to have sharp or jagged edges for puncturing any oxide layers that may arise on a solder bump. The more oxide layers of solder bumps are punctured and the greater the force placed on solder bump for electrical conductivity to be established, the less durable the solder bump will be for use in testing printed circuit boards.

In contrast, test access component have a core of a rigid and/or durable material that is not subject to mechanical degradation. Use of a test access component provides for a stable component when test contacts are made between test probes and test access components. Test access components are less prone to deformity than solder bumps upon contact with test probes. In addition, test access components are also less prone to reflow than solder bumps when the temperature is raised.

A large number of tests were performed with test probes in making contact with test access components. In general, high cycle count failures can be used to estimate the probability of low cycle count failures that may occur. In addition, Weibull plots show that use of test access components is much more reliable than use of solder paste bead probe. As an example, a 01005 test access component had only one failure at 250,000 cycles. Moreover, data indicates that there is a 1% (10,000 part per million) chance of failure for less than 10 cycles for solder paste bead probes. In observing usage of test access components, on the other hand, no damage was found to resistors even after 1.2 million cycles.

Figure 8:
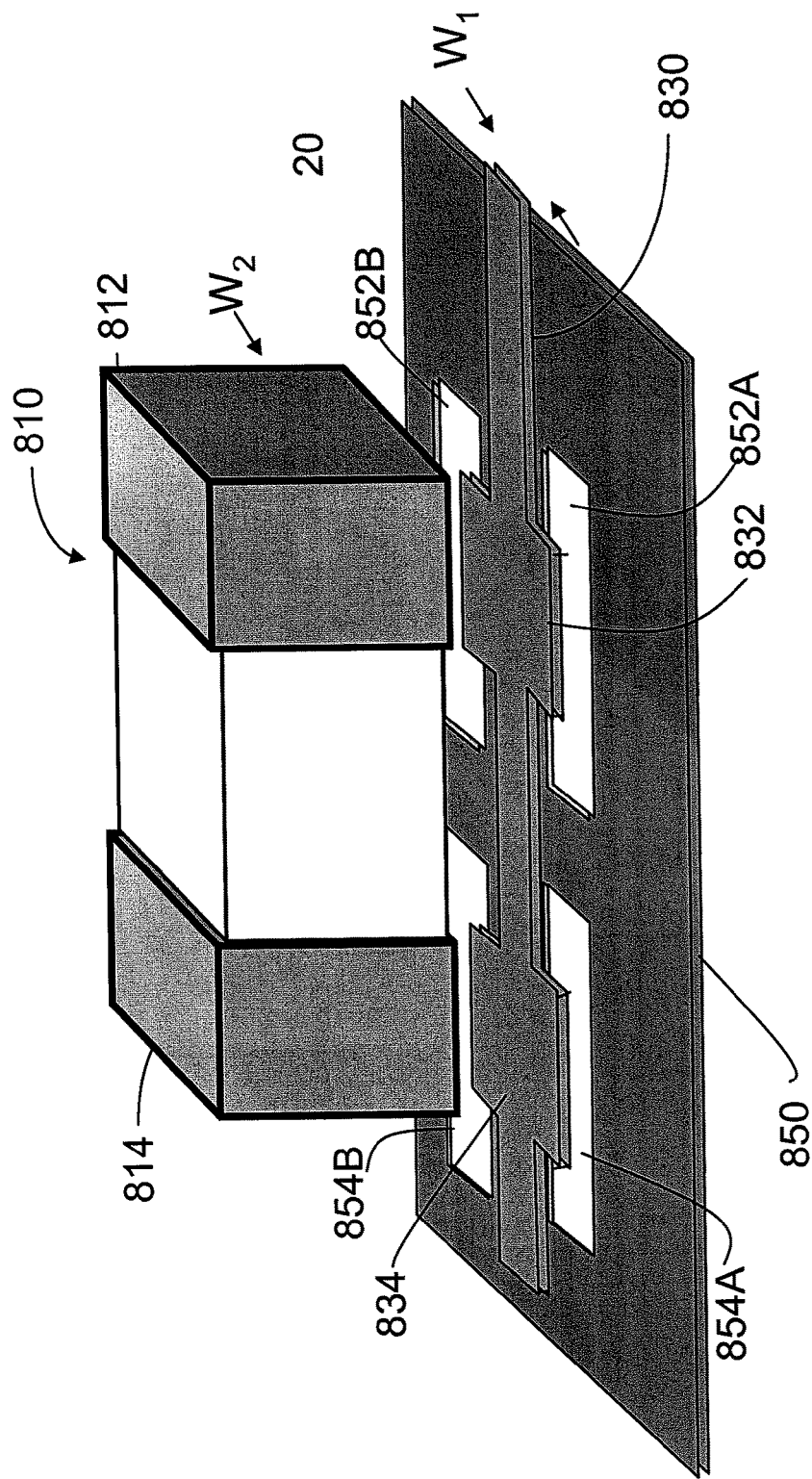
FIG. 8 is a perspective schematic of a test access component in engagement with a printed circuit board, with portions of the printed circuit board cut-away to illustrate a reference structure within the printed circuit board, according to some embodiments.

Turning to FIG. 8, a further embodiment is illustrated. FIG. 8 illustrates a test access component 810 and a trace 830 to which component 810 is to be soldered. Trace 830 may be a trace within a printed circuit board containing other components, which are not illustrated for simplicity. As is known in the art, a trace in a printed circuit board is conventionally embedded with a dielectric matrix, but the matrix is not shown in FIG. 8, for simplicity.

FIG. 8 also illustrates a reference structure 850 within the printed circuit board. A printed circuit board may contain alternating layers of signal traces and reference structures. Though signal traces are generally narrow, reference structures tend to be relatively expansive, and are sometimes called reference planes. In operation, the reference planes are conventionally electrically connected to a reference voltage, such as ground or a DC power supply. By alternating layers with signal traces and reference planes, the impedance of the signal traces may be controlled based on their proximity to the reference planes. The reference planes may also prevent electrical interference between signal traces on adjacent layers. Accordingly, the reference planes are generally expansive extending over substantially throughout the printed circuit board. Though FIG. 8 illustrates only a region of a reference plane that underlies a contact region containing component 810, the reference structure 850 may underlie and extend beyond the contact region, but the full extent of reference structure 850 is not shown for simplicity.

Though a pattern of a layer of signal traces and a reference structure may be repeated multiple times in a printed circuit board, only an upper layer, to which component 810 may be soldered, is illustrated in FIG. 8 to reveal the structure of trace 830 and reference structure 850.

In the embodiment of FIG. 8, a component 810 included for test access has a width $W_2$ that is wider than the nominal width, $W_1$, of trace 830 to which component 810 is attached. In this embodiment, trace 830 is shown to contain pads 832 and 834 to which end caps 812 and 814 may be soldered. As illustrated, pads 832 and 834 have a width equal to or greater than width $W_2$ and therefore cause a localized widening of trace 830. Such dimensions may ensure a reliable electrical and mechanical connection between trace 830 and component 810 when component 810 is soldered to trace 830.

However, these dimensions also create changes in the width of trace 830 that, absent other compensation, would create localized changes in the impedance of trace 830. Localized changes in impedance of traces that carry high frequency signals can be undesirable because signal reflections or other types of signal distortion can occur in the vicinity of the localized changes. To compensate for the changes in the width of signal trace 830, modifications may be made to other conductive structures within a printed circuit board to which component 810 is mounted.

FIG. 8 illustrates that openings 852A, 852B, 854A and 854B have been formed in reference structure 850 in the vicinity of pads 832 and 834. Such openings align with regions of increased width of trace 830 and offset the effect on impedance of trace 830 of pads 832 and 834. In this example, increased width of pads 832 and 834, absent other compensation, would increase capacitive coupling between pads 832 and 834 and reference structure 850, which is a factor that would contribute to a change in impedance of trace 830. However, by creating openings 852A, 852B, 854A and 854B in reference structure 850, there is an offsetting decrease in capacitance between trace 830 and reference structure 850. Consequently, a localized change in impedance caused by pads 832 and 834 is reduced or eliminated.

FIG. 8 illustrates one example of openings that may be formed in reference structure 850. Other types of modifications may be used to reduce capacitive coupling between trace 830 and reference structure 850 to compensate for increased width of pads 832 and 834. For example, a hole may be cut in reference structure 850 under each of pads 832 and 834. As another example, a single hole may be cut in reference structure 850 beneath both pads 832 and 834 or generally in the vicinity of component 810.

EXAMPLES

Results of a number of electrical and mechanical tests are described in the following examples.

Example 1

In one example, electrical tests were performed on usage of the test access component for printed circuit boards using a Vector Network Analyzer for evaluating electrical performance characteristics of test access component devices. A FR-4 based printed circuit board was fabricated and tests were performed on 2.5 inch etch lengths with various sizes of test access components. The insertion loss of test access components were measured from 10 MHz to 20 GHz. The insertion loss using a 01005 and 0201 test access components from 10 MHz to 20 GHz on a FR-4 printed circuit board was −6 dbV. In comparison, the insertion loss using a solder paste ball from 10 MHz to 20 GHz on a FR-4 printed circuit board was −7 dbV. The insertion loss using a 0402 test access component from 10 MHz to 20 GHz on a FR-4 printed circuit board was −7.5 dbV. It was found that the insertion loss at 20 GHz on a FR-4 printed circuit board dielectric was equivalent to a solder paste ball with a 0.008 inch wide etch. In addition, the loss of −6 dbV was mainly due to the FR-4 material and skin effect losses rather than the test access component.

Example 2

In another example, mechanical tests were performed on usage of the test access component for printed circuit boards. An in-circuit test fixture was fabricated for testing the mechanical robustness of test access components. 4-wire Kelvin contact resistance measurements were used as a metric for judging the mechanical performance due to repeated probing. In addition, 5 ounce flat head probes were cycled on test access components in an in-circuit test fixture. During each contact cycle, Kelvin contact resistance measurements were performed on all test access components on a given board. Data was collected for groups of 100 fixture cycles. Minimum, average and maximum values for each block of 100 runs were then recorded.

Over 100,000 mechanical cycles probed by a five ounce flat head pogo pin. For a 01005 test access component, the test access component being about 0.005 inches wide, the average resistance was measured to be between 0.01 ohms and 0.015 ohms, close to 0.014 ohms, with little deviation. For a 0201 test access component, the test access component being about 0.010 inches wide, the average resistance was measured to be greater than 0.01 ohms, with little deviation. For a 0402 test access component, the test access component being about 0.020 inches wide, the average resistance was measured to be between 0.01 ohms and 0.015 ohms, with little deviation. Compared with a solder paste bead probe, the solder paste being about 0.005 inches wide, the resistance was measured with a large degree of deviation. In this regard, the mechanical robustness of the system along with adequate electrical connectivity using the test access component is maintained after being probed by a five ounce test probe beyond 100,000 cycles. Such durability in the ability to be probed beyond 100,000 cycles is well beyond the lifetime of a solder paste ball for similar usage in testing printed circuit boards.

The foregoing written specification is to be considered to be sufficient to enable one skilled in the art to practice the invention. While the best mode for carrying out the invention has been described in detail, those skilled in the art to which this invention relates will recognize various alternative embodiments including those mentioned above as defined by the following claims.

For example, embodiments of the invention were described in connection with testing of printed circuit boards. The techniques describe herein may also be employed for testing other forms of circuit assemblies in which connection to signal carrying members is to be provided.

Also, test access components may be used in combination with one or more other testing techniques. For example, test access components may be used in combination with capacitive testing approaches. The different approaches may be used to test different aspects of a printed circuit board or may be used complimentarily, with a test access component providing a location through which a stimulus signal may be coupled and a capacitive probe plate used to sense a response to that stimulus signal.

Accordingly, the examples disclosed herein are not to be construed as limiting of the invention as they are intended merely as illustrative of particular embodiments of the invention as enabled herein. Therefore, systems and methods that are functionally equivalent to those described herein are within the spirit and scope of the claims appended hereto. Indeed, various modifications of the invention in addition to those shown and described herein will become apparent to those skilled in the art from the foregoing description and fall within the scope of the appended claims.

What is claimed is:

1. An electrical assembly for testing of a printed circuit board, the electrical assembly comprising:
    the printed circuit board comprising a conductive trace and a surface; and
    a test access component on the surface and having at least two points of electrical contact raised above the surface, each of the at least two points being electrically connected to the conductive trace.

2. The electrical assembly for testing of a printed circuit board of claim 1, wherein the test access component comprises a surface mount component.

3. The electrical assembly for testing of a printed circuit board of claim 1, further comprising solder forming an electrical connection between each of the at least two points of the test access component and the conductive trace.

4. The electrical assembly for testing of a printed circuit board of claim 1, wherein:
    the conductive trace comprises a first pad and a second pad and a first of the at least two points of contact is made to the first pad and a second of the at least two points of contact is made to the second pad;
    the printed circuit board further comprises a planar reference structure comprising a region underlying the contact region, the planar reference structure comprising at least one opening in the region.

5. The electrical assembly for testing of a printed circuit board of claim 1, wherein the conductive trace provides electrical connectivity between regions for providing electrical functionality on the printed circuit board.

6. The electrical assembly for testing of a printed circuit board of claim 1, further comprising a test probe in electrical contact with the test access component at at least one location raised above the surface.

7. The electrical assembly for testing of a printed circuit board of claim 6, wherein the at least one location comprises the two points of electrical contact such that the test probe is in electrical contact with the two points of electrical contact of the test access component raised above the surface.

8. The electrical assembly for testing of a printed circuit board of claim 6, wherein the at least one location comprises one of the two points of electrical contact such that the test probe is placed in electrical contact with one of the two points of electrical contact of the test access component raised above the surface.

9. The electrical assembly for testing of a printed circuit board of claim 2, wherein the surface mount component comprises a 01005 surface mount component.

10. The electrical assembly for testing of a printed circuit board of claim 2, wherein the surface mount component comprises a 0204 surface mount component.

11. The electrical assembly for testing of a printed circuit board of claim 2, wherein the surface mount component comprises a 0402 surface mount component.

12. The electrical assembly for testing of a printed circuit board of claim 1, wherein the test access component comprises at least one insulative region and at least two conductive end-caps.

13. The electrical assembly for testing of a printed circuit board of claim 1, wherein the surface of the printed circuit board comprises an insulative region and the at least two points of electrical contact of the test access component comprise a surface of a conductive region that is raised above a surface of an insulative region.

14. The electrical assembly for testing of a printed circuit board of claim 6, wherein the test probe includes a test surface that is greater in surface area than a contact surface of the test access component.

15. The electrical assembly for testing of a printed circuit board of claim 6, wherein the test probe includes a test surface that comprises jagged edges.

16. The electrical assembly for testing of a printed circuit board of claim 1, wherein the test access component comprises a hexahedron shape.

17. The electrical assembly for testing of a printed circuit board of claim 1, wherein the test access component is adapted is adapted and configured for test access such that the electrical assembly maintains mechanical robustness after being probed at a point of the at least two points above the surface by a five ounce test probe more than 100,000 cycles.

18. An electrical assembly for testing of a printed circuit board, the electrical assembly comprising:
    the printed circuit board, comprising:

a conductive trace on the printed circuit board;
solder disposed on the conductive trace; and
a surface mount component disposed in the solder, the solder forming at least two points of electrical connection between the surface mount component and the conductive trace, whereby the two points of connection are shorted by the conductive trace.

19. The electrical assembly for testing of a printed circuit board of claim 18, wherein the surface mount component comprises a resistor.

20. The electrical assembly for testing of a printed circuit board of claim 18, further comprising:
a test probe in contact with the surface mount component.

* * * * *